United States Patent
Fang et al.

(10) Patent No.: US 10,791,854 B2
(45) Date of Patent: Oct. 6, 2020

(54) BRACKET AND DISPLAY DEVICE

(71) Applicants: BOE INTELLIGENT IOT TECHNOLOGY CO., LTD., Beijing (CN); BOE TECHNOLOGY GROUP CO., LTD., Beijing (CN)

(72) Inventors: Deli Fang, Beijing (CN); Huijun Li, Beijing (CN); Pei Li, Beijing (CN)

(73) Assignees: BOE INTELLIGENT TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/380,532

(22) Filed: Apr. 10, 2019

(65) Prior Publication Data
US 2019/0231098 A1   Aug. 1, 2019

Related U.S. Application Data

(63) Continuation-in-part of application No. PCT/CN2018/105798, filed on Sep. 14, 2018.

(30) Foreign Application Priority Data

Nov. 14, 2017  (CN) .................. 2017 2 1514932 U

(51) Int. Cl.
*A47G 1/16* (2006.01)
*H05K 5/00* (2006.01)
(Continued)

(52) U.S. Cl.
CPC ........... *A47G 1/1626* (2013.01); *F16M 11/04* (2013.01); *F16M 11/22* (2013.01); *F16M 13/02* (2013.01);
(Continued)

(58) Field of Classification Search
CPC ... B25B 17/02; B25B 23/0021; B25B 13/481; B25B 17/00; B25B 21/02; F16M 11/10;
(Continued)

(56) References Cited

U.S. PATENT DOCUMENTS

| 1,993,947 A | * | 3/1935 | Rosenberg | A47G 1/143 40/747 |
| 5,927,673 A | * | 7/1999 | Kurokawa | F16M 11/10 24/462 |
| 6,003,260 A | * | 12/1999 | Chang | G09F 1/12 248/472 |
| 2003/0001053 A1 | | 1/2003 | Cho et al. | |

(Continued)

FOREIGN PATENT DOCUMENTS

| CN | 2847812 Y | 12/2006 |
| CN | 201299349 Y | 9/2009 |
| CN | 207814871 U | 9/2018 |

OTHER PUBLICATIONS

International Search Report; Application No. PCT/CN2018/105798; dated Nov. 20, 2018; English Translation Attached.

*Primary Examiner* — Abhishek M Rathod
(74) *Attorney, Agent, or Firm* — Nath, Goldberg & Meyer; Joshua B. Goldberg

(57) ABSTRACT

The present disclosure provides a bracket and a display device. The bracket includes: a support arm; a limiting part disposed at a side of the support arm and connected to the support arm; and a connecting part disposed at a side of the support arm opposite to the limiting part and connected to the support arm, wherein the connecting part is provided with at least one support fixing hole.

18 Claims, 26 Drawing Sheets

(51) Int. Cl.
 H05K 5/02 (2006.01)
 F16M 11/22 (2006.01)
 F16M 11/04 (2006.01)
 G12B 9/08 (2006.01)
 F16M 13/02 (2006.01)
 G09G 5/00 (2006.01)

(52) U.S. Cl.
 CPC ............... G09G 5/00 (2013.01); G12B 9/08 (2013.01); H05K 5/0017 (2013.01); H05K 5/0204 (2013.01)

(58) Field of Classification Search
 CPC .... F16M 13/00; F16M 13/005; F16M 11/105; F16M 11/2021; F16M 2200/08; F16M 11/041; F16M 13/04; G06F 1/1601; G06F 1/1626; G06F 1/166; G06F 1/16; G06F 2200/1612; Y10S 248/919; Y10T 16/54
 See application file for complete search history.

(56) References Cited

U.S. PATENT DOCUMENTS

| | | | | |
|---|---|---|---|---|
| 2005/0263660 | A1* | 12/2005 | Hsiung | H05K 5/0234 248/291.1 |
| 2006/0049327 | A1* | 3/2006 | Chen | F16M 11/105 248/371 |
| 2009/0223101 | A1* | 9/2009 | Wang | A47G 1/142 40/747 |
| 2011/0164357 | A1* | 7/2011 | Yeom | F16M 11/10 361/679.01 |
| 2012/0170197 | A1* | 7/2012 | Shen | F16M 11/105 361/679.6 |
| 2015/0177784 | A1* | 6/2015 | Varadarajan | G06F 1/166 361/679.3 |
| 2016/0106190 | A1* | 4/2016 | Song | A45C 11/00 341/679.3 |
| 2017/0142298 | A1* | 5/2017 | Fain | H04N 5/2251 |
| 2017/0152991 | A1* | 6/2017 | Cheng | A45F 5/10 |
| 2018/0014507 | A1* | 1/2018 | Lorig | A01K 15/027 |
| 2019/0231098 | A1 | 8/2019 | Fang et al. | |

* cited by examiner

BRACKET AND DISPLAY DEVICE

CROSS-REFERENCE TO RELATED APPLICATION

This application claims priority from Chinese Patent Application No. 201721514932.3 filed with the Chinese intellectual Property Office on Nov. 14, 2017, the disclosure of which is incorporated herein by reference in its entirety.

TECHNICAL FIELD

The present disclosure relates to a technical field of display technology, and particularly relates to a bracket and a display device.

BACKGROUND

With the development of science and technology, display devices are more and more widely used in, for example, family living rooms, bedrooms, offices, conference halls, exhibition halls, hotels, airports, railway stations, hospitals, bus stations, shopping malls and the like.

However, the existing components used for placing or supporting the display device usually have a single function, which is difficult to place or support the display device in a variety of ways.

SUMMARY

The present disclosure provides a bracket and a display device.

According to an aspect of the disclosure, there is provided a bracket comprising:

a support arm;

a limiting part disposed at a side of the support arm and connected to the support arm; and a connecting part disposed at a side of the support arm opposite to the limiting part and connected to the support arm, wherein the connecting part is provided with at least one support fixing hole.

In some embodiments, the support arm is provided with at least one hanging fixing hole and includes a first support arm and a second support arm, and the at least one hanging fixing hole includes a first hanging fixing hole provided on the first support arm and a second hanging fixing hole provided on the second support arm.

In some embodiments, the at least one support fixing hole includes a first support fixing hole and a second support fixing hole, and a distance between the first hanging fixing hole and the second hanging fixing hole is the same as a distance between the first support fixing hole and the second support fixing hole.

In some embodiments, the bracket has a triangular shape.

In some embodiments, the connecting part has a planar shape, and is provided with at least two support fixing holes thereon.

In some embodiments, the connecting part includes a first curved portion with a curvature r1 disposed between two planar portions and connected to the support arm via one of the planar portions, where r1 is in the range of 0.04-0.06.

In some embodiments, the limiting part includes a second curved portion with a curvature r2 disposed between two planar portions and connected to the support arm via one of the planar portions, where r2 is in the range of 0.1-0.12.

In some embodiments, the connecting part and the limiting part are curved toward the same side with respect to the support arm.

In some embodiments, the support arm is a telescopic support arm, and the support arm includes a telescopic chute, and a telescopic rod disposed in the telescopic chute, the telescopic rod is slidable relative to the telescopic chute, an end of the telescopic rod is provided with a first through hole, a spring and two steel balls at both ends of the spring are disposed in the first through hole, and either side of the telescopic chute is provided with at least one second through hole into which at least part of the steel ball can enter.

In some embodiments, the support arm, the limiting part and the connecting part are integrally formed.

In some embodiments, the at least one support fixing hole and the at east one hanging fixing hole are slotted holes.

In some embodiments, the at least one support fixing hole and the at least one hanging fixing hole each have a first hole portion and two second hole portions, where the first hole portion has a greater size than the second hole portions and is in communication with the two second hole portions, while the two second hole portions are symmetrically disposed with respect to the first hole portion.

In some embodiments, a first limiting part is provided at a side of the first support arm, a second limiting part is provided at a side of the second support arm, and the first and second limiting parts are spliced to form a limiting hole.

In some embodiments, the limiting hole has a third hole portion and a fourth hole portion, and the third hole portion has a greater size than the fourth hole portion and is in communication with the fourth hole portion.

In some embodiments, the support arm is further provided with a third support arm, a first limiting part is provided at a side of the first support arm, a second limiting part is provided at a side of the second support arm, and a third limiting part is provided at a side of the third support arm, where each of the first, second and third limiting parts is provided with a limiting hole.

According to another aspect of the disclosure, there is provided a display device comprising a display screen and the bracket as described above.

In some embodiments, the display screen is provided with a connecting slot for connecting to the bracket via at least one hanging fixing hole provided on the support arm when the bracket is used for hanging.

In some embodiments, the display screen is provided with a connecting slot for connecting to the bracket via the at least one support fixing hole when the bracket is used for supporting.

In some embodiments, the display screen is provided with four connecting slots, and a distance between two connecting slots in a horizontal direction is the same as a distance between two connecting slots in a vertical direction.

In some embodiments, the connecting slot is provided with a T-shaped telescopic member that is inserted into one of at least one hanging fixing hole provided on the support arm and the at least one support fixing hole so that the bracket is connected to the display screen.

DETAILED DESCRIPTION

To improve understanding of the technical solution of the present disclosure for those skilled in the art, the present disclosure will now be described in detail in conjunction with accompanying drawings and exemplary embodiments.

Figure 1A:
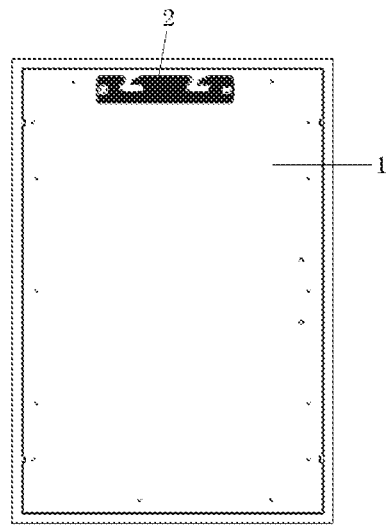
FIGS. 1a and 1b are schematic views respectively showing a display screen hanging structure and a hanging part according to exemplary embodiments of the present disclosure.
Figure 1B:
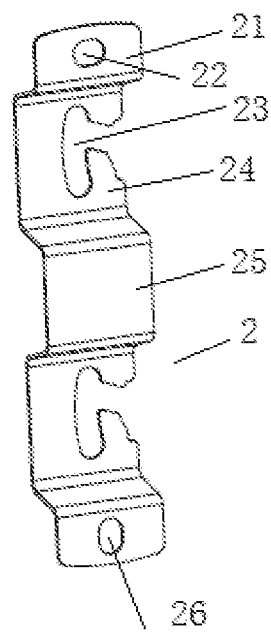

Some exemplary embodiments of the disclosure provide a hanging part. As shown in FIG. 1a, a display screen 1 may be fixed (bond) to a wall, ground, table top or other frame bodies via a hanging part 2 at a back of the display screen 1. The display screen 1 is hung on a wall in such a way that the hanging part 2 is fixed on the wall first, and then the display screen 1 is connected to the hanging part 2, thereby the display screen 1 is reliably fixed. In the exemplary embodiments, as shown in FIG. 1b, the hanging part 2 includes two end flat sections 21 at two ends, an intermediate flat section 25 at an intermediate position, and two protrusions 24 between the end flat sections 21 and the intermediate flat section 25. The end flat sections 21 and the intermediate flat section 25 lie in the same plane from which the protrusions 24 protrude. The two end flat sections 21 each have elongated holes 22, 26 which are oriented perpendicular to each other such that the hanging part 2 has a certain mounting margin for ease of installation. A recessed portion 23 with a T-shape or any other suitable shape is provided in the protrusions 24.

The hanging part provided by the exemplary embodiments may be attached to the display screen using one of the elongated holes and the recessed portion, while the other is used for fixing to a wall, floor, table top or other frame bodies. Therefore, the hanging part provided by the exemplary embodiments may place or support the display screen in various ways.

Some exemplary embodiments of the disclosure provide some brackets. As shown in FIGS. 2a-3c, the brackets include: a support arm 30; a limiting part 40 disposed at a side of the support arm 30 and connected to the support arm 30; and a connecting part 50 disposed at a side of the support arm 30 opposite to the limiting part 40 and connected to the support arm 30. The connecting part 50 is provided with at least one support fixing hole 51.

In an exemplary embodiment, as shown in FIGS. 2a-2e and 3a, the bracket includes a limiting hole 43 provided on the limiting part 40 and at least one hanging fixing hole provided on the support arm 30. In another exemplary embodiment, as shown in FIGS. 2f and 3b, the bracket does not include the limiting hole 43 and the at least one hanging fixing hole. In yet another exemplary embodiment, as shown in FIG. 3c, the bracket does not include the limiting hole 43, but includes the at least one hanging fixing hole provided on the support arm 30.

Figure 3A:
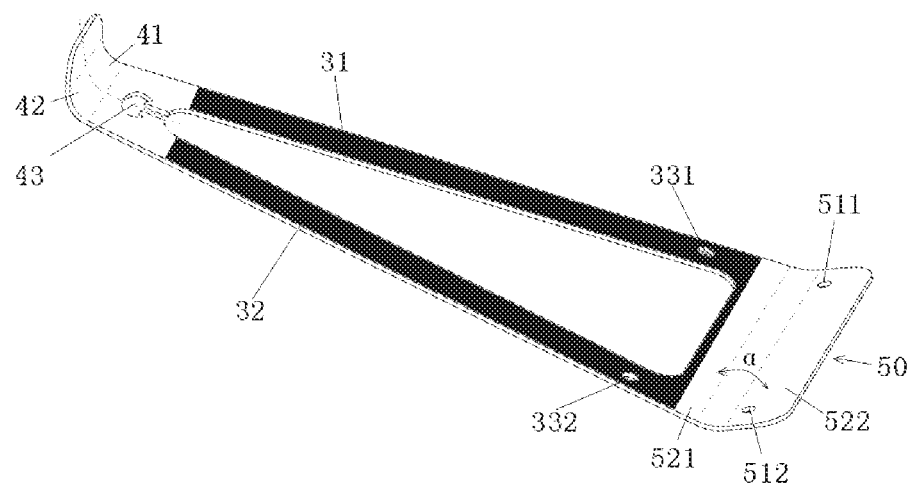
FIG. 3a is a perspective view of the bracket shown in FIGS. 2a-2e.
Figure 3B:
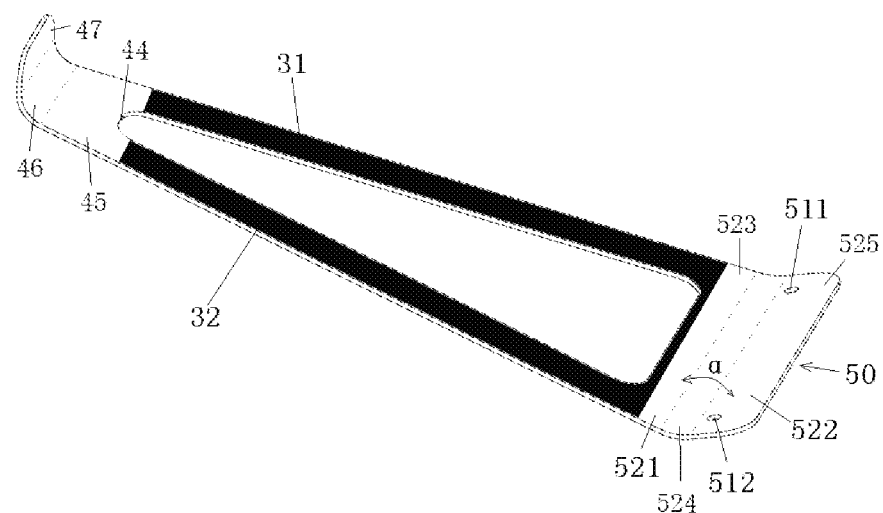
FIG. 3b is a perspective view of the bracket shown in FIG. 2f.
Figure 3C:
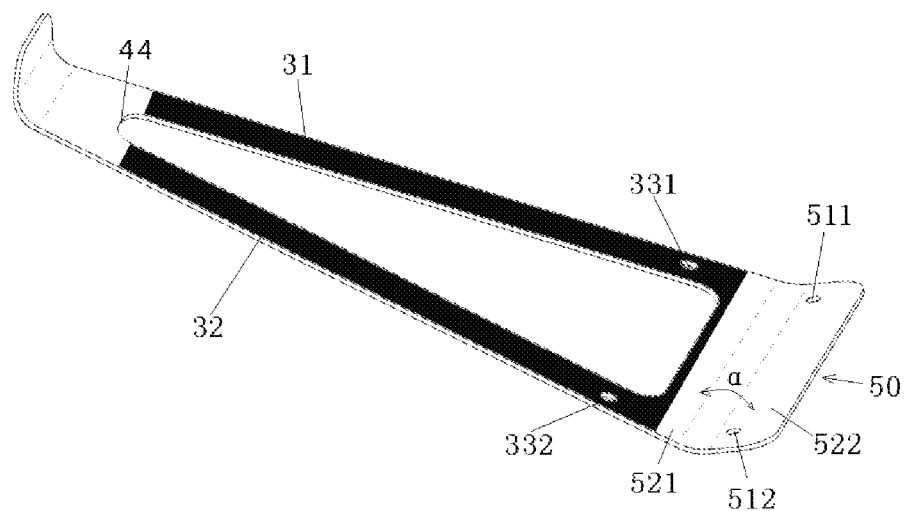
FIG. 3c is a perspective view of a variation of the bracket shown in FIG. 2f.

As shown in FIGS. 3a and 3c, the support arm 30 is provided with at least one hanging fixing hole and includes a first support arm 31 and a second support arm 32. The at least one hanging fixing hole includes a first hanging fixing hole 331 provided on the first support arm 31, and a second hanging fixing hole 332 provided on the second support arm 32. The at least one support fixing hole 51 includes a first support fixing hole 511 and a second support fixing hole 512. A distance between the first hanging fixing hole 331 and the second hanging fixing hole 332 is the same as a distance between the first support fixing hole 511 and the second support fixing hole 512.

As shown in FIG. 2f, a first limiting part 41 is provided at a side of the first support arm 31, and a second limiting part 42 is provide at a side of the second support arm 32, where the first limiting part 41 and the second limiting part 42 are spliced to form a hanging spot or position 44. At this time, the bracket has a triangular shape, and the bracket of this shape can ensure that the display device formed by assembling the bracket and the display screen has good stability whether it is hung on a wall or placed.

Figure 2A:
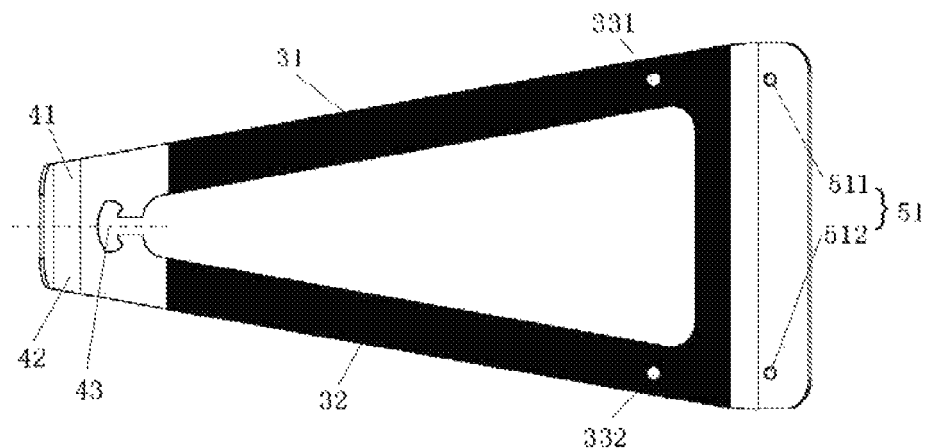
FIGS. 2a-2e are structural schematic views showing a bracket according to exemplary embodiments of the present disclosure.
Figure 2B:
Figure 2C:
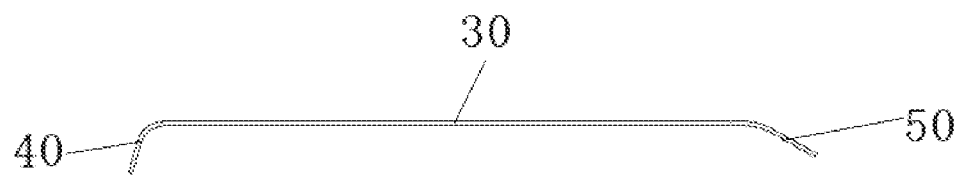
Figure 2D:
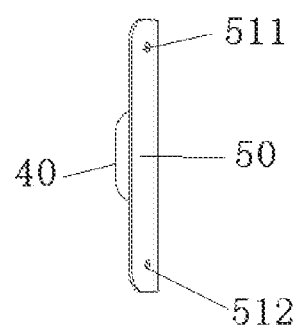
Figure 2E:
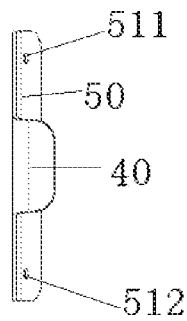
Figure 2F:
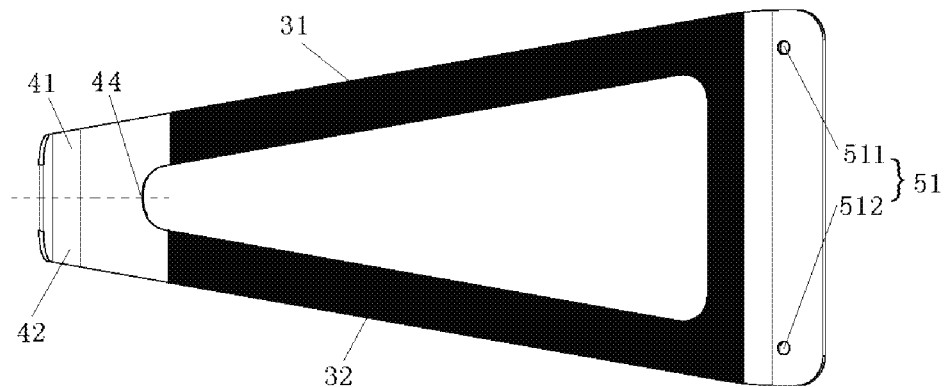
FIG. 2f is a structural schematic view of a variation of the bracket shown in FIGS. 2a-2e.

In the drawings, FIG. 2b is a left view of the bracket shown in FIG. 2a, FIG. 2c is a right view of the bracket, FIG. 2d is a top view of the bracket, and FIG. 2e is a bottom view of the bracket. As an alternative to the exemplary embodiments, the support arm 30, the limiting part 40, and the connecting part 50 may be integrally formed. In the integrally formed brackets shown in FIGS. 2a and 2f, whether for hanging or placing a display screen, respective parts of the bracket bear force more uniformly with respect to each other. It should be noted that the integrally formed bracket may be made of a metal material or a resin material, which is not specifically limited herein, and may be selected according to actual needs.

As an alternative to the exemplary embodiments, the connecting part 50 may have a planar shape and provided with at least two support fixing holes, which are a first support fixing hole 511 and a second support fixing hole 512, respectively.

That is, the connecting part 50 has a planar structure, i.e., the planar connecting part 50 is directly connected to the first support arm 31 and the second support arm 32, and the planar connecting part 50 may form any angle between 0-180°, for example, 30-150°, with respect to the plane of the first support arm 31 and the second support arm 32. The connecting part 50 may be provided with a number of support fixing holes 51 corresponding to the number of the connecting slots at the back of the display screen. In use, it only needs to fix the support fixing holes 51 with the connecting slots of the display back by screws or the like. When the disposing mode of the display screen is changed, for example, from placing to wall hanging, the bracket may be removed from the back of the display by simply loosening the screw, and then the at least one hanging fixing hole is fixed to the connecting slots at the back of the display to realize hanging. It can be understood that in addition to screwing, the at least one support fixing hole 51 may adopt other fastening methods, such as hinging, rigid joint, etc.

As an alternative to the exemplary embodiments, as shown in FIG. 3*b*, the connecting part 50 may include a first curved portion 524 with a curvature r1 disposed between two planar portions 523 and 525 and connected to the support arm 30 via one of the planar portions, where r1 is in the range of 0.04-0.06.

Figure 8A:
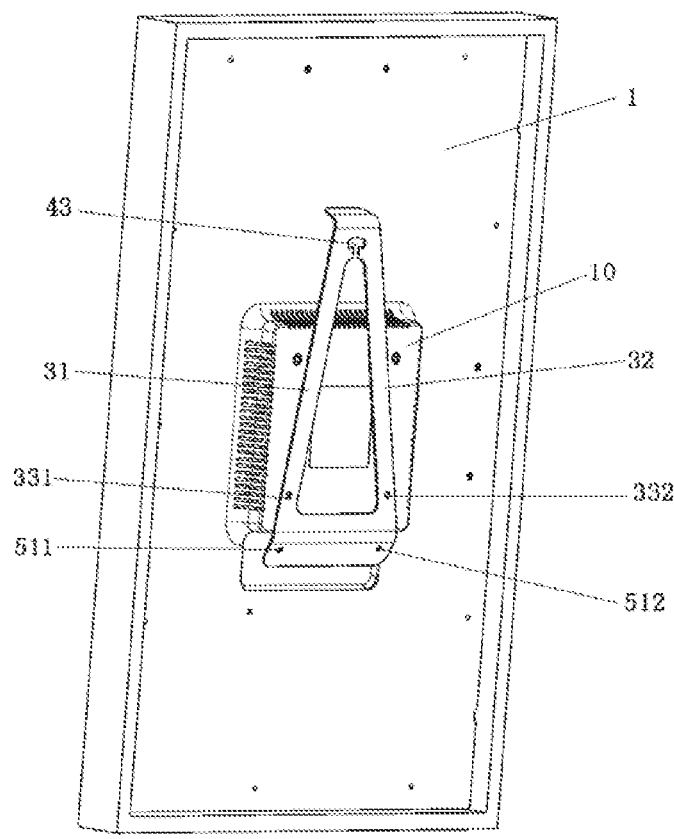
FIG. 8a is a schematic view showing a configuration of the bracket shown in FIG. 3a mounted on the display screen.
Figure 8B:
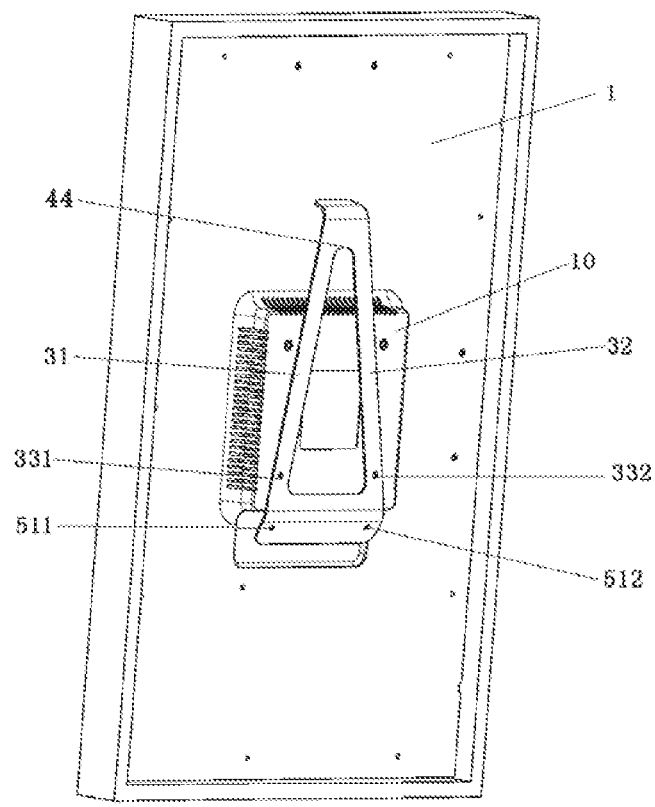
FIG. 8b is a schematic view showing a configuration of the bracket shown in FIG. 3c mounted on the display screen.

As shown in FIG. 3*b*, the connecting part 50 has a non-planar structure with a certain curvature, and the curved surface may be regarded as a combination of two surfaces, where one surface closer to the support arm 30 (specifically, 31, 32) is a first support surface 521, and the other surface away from the support arm 30 is a second support surface 522. The first support fixing hole 511 and the second support fixing hole 512 are disposed on the second support surface 522. The first support surface 521 and the second support surface 522 are connected by an arc-shaped chamfer, that is, the planar portion 523 corresponding to the first support surface 521 is connected to the planar portion 525 corresponding to the second support surface 522 via the first curved portion 524 corresponding to the arc-shaped chamfer, and an angle between the first support surface 521 and the second support surface 522 is α, where 0<α<180°. The function of this design is that, on one hand, when the connecting part 50 is used for supporting the display screen, a lower surface of the second support surface 522 directly contacts the back of the display screen, and the support arm 30 and the limiting part 40 serve as support legs, thereby the support surface 522 is subjected to a pressure from the display screen. On the other hand, the magnitude of a may be set to control an inclination angle of the display screen during placement. The smaller the α, the larger the inclination angle of the display screen during placement, and vice versa. In addition, when the bracket is used for hanging the display screen, as shown in FIGS. 8*a* and 8*b*, an inside of the angle is clamped and engaged on a base at the connecting slot at the back of the display screen, thereby playing a role of holding the display screen.

It should be noted that similar to the connecting part 50, the limiting part 40 shown in FIG. 3*b* also includes a second curved portion 46 with a curvature r2 disposed between two planar portions 45, 47, and connected to the support arm 30 (more specifically, the first and second support arms 31, 32) via the planar portion 45, where r2 is in the range of 0.1-0.12.

The curved limiting part 40 increases a contact area between the limiting part 40 and the plane to be placed, thereby increasing the support stability of the bracket. Further, as shown in FIG. 3*b*, the curved surfaces of the limiting part 40 and the connecting part 50 are curved toward the same side with respect to the support arm 30. Such design is more convenient for installation at the time of wall hanging.

Figure 9:
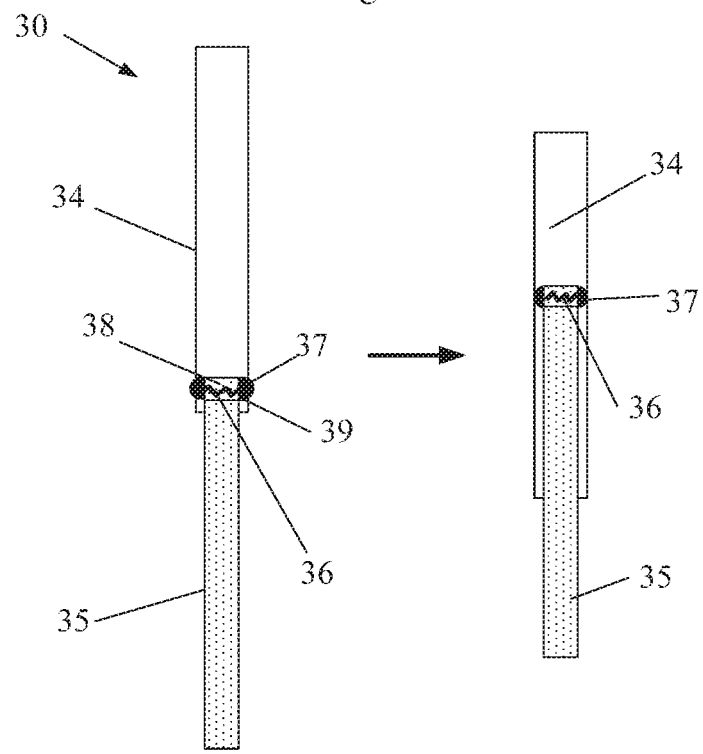
FIG. 9 is a structural schematic view showing a support arm according to exemplary embodiments of the present disclosure.

As an alternative to the exemplary embodiments, the support arm is a telescopic support arm. As shown in FIG. 9, the support arm 30 includes a telescopic chute 34 and a telescopic rod 35 disposed in the telescopic chute 34, and the telescopic rod 35 is slidable with respect to the telescopic chute 34. An end of the telescopic rod 35 entering the telescopic chute 34 is provided with a first through hole 38, and a spring 36 and steel ball 37 at both ends of the spring 36 are disposed in the first through hole 38. Either side of the telescopic chute 34 is provided with at least one second through hole 39. The second through hole 39 may have an aperture greater or smaller than a diameter of the steel ball 37 so that at least part of the steel ball 37 may enter the second through hole 39 to perform limiting.

In the exemplary embodiments, the telescopic rod 35 is embedded in the telescopic chute 34, the first through hole 38 may be laterally disposed, while the second through hole 39 is disposed at two side of an inner wall width of the end of the telescopic chute 34 that allows the telescopic rod 35 to enter.

That is, in addition to setting the magnitude of a to control the inclination angle of the display screen during placement as discussed above, the inclination angle of the display screen during placement may also be controlled by changing a length of the support arm itself. Specifically, a plurality of through holes may be disposed on the support arm for engaging the steel ball 37 to define an effective total length of the telescopic chute 34 and the telescopic rod 35. FIG. 9 illustrates a telescopic manner of the support arm. It can be understood that other similar forms of telescopic structures may be used to replace the support arm of the exemplary embodiments.

Figure 10:
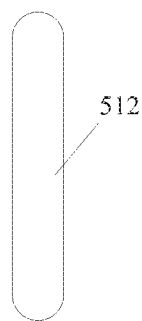
FIG. 10 is a structural schematic view showing a support fixing hole according to exemplary embodiments of the present disclosure.
Figure 11:
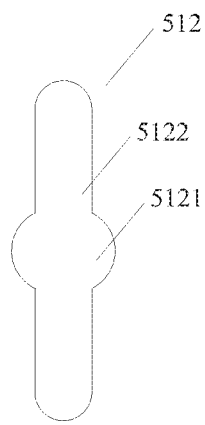
FIG. 11 is a structural schematic view showing another support fixing hole according to exemplary embodiments of the present disclosure.

In the exemplary embodiments, as shown in FIG. 3*c*, the hanging fixing holes 331, 332 or the support fixing holes 511, 512 are all circular holes. It can be understood that the specific shape of the hanging fixing holes 331, 332 or the support fixing holes 511, 512 may be adjusted as needed, that is, these holes may have any suitable shape. For example, as shown in FIG. 10, the hanging fixing holes 331, 332 or the support fixing holes 511, 512 may be slotted holes. In this way, when the bracket of the exemplary embodiments of the present disclosure is used for hanging the display screen on the wall, a position of the mounting screw in the slotted holes may be adjusted as needed to adjust a height of the display screen (for the specific installation manner, please refer to FIG. 15*a* or 15*g*); when the bracket of the exemplary embodiments of the present disclosure is used for placing the display screen, a position of the mounting screw in the slotted holes may be adjusted as needed to adjust an inclination angle of the display screen (for the specific installation manner, please refer to FIG. 13*a*, 13*g*, 14*a* or 14*g*) so that the user may watch the display screen at a comfortable viewing angle. Further, as shown in FIG. 11, the hanging fixing holes 331, 332 or the support fixing holes 511, 512 may also have a shape as shown in FIG. 11. That is, the hanging fixing holes 331, 332 or the support fixing holes 511, 512 may have a first hole portion 5121 and two second hole portions 5122. The first hole portion 5121 has a greater size than the second hole portions 5122 and is in communication with the two second hole portions 5122, while the two second hole portions 5122 are symmetrically disposed with respect to the first hole portion 5121. With this form, the hanging fixing holes 331, 332 or support fixing holes 511, 512 may be securely attached to the T-shaped member (which will be described in detail below) on the display screen without fastening. That is, a head of the T-shaped member first passes through the first hole portion 5121, and then reaches the second hole portion 5122 which is smaller in size than the head of the T-shaped member but larger than a rod of the T-shaped member, thereby causing the display screen to be securely attached to the bracket of the exemplary embodiments under an action of gravity of the display screen. The hanging fixing holes 331, 332 or the support fixing holes 511, 512 of such a configuration may reliably connect the display screen and the bracket in a manner that does not require fastening, so that the user can operate conveniently, saving time and labor.

It should be understood that although FIG. 11 only shows the configuration of the support fixing hole 512, the hanging fixing holes 331, 332 and the support fixing hole 511 may have the same configuration as the support fixing hole 512.

Figure 12:
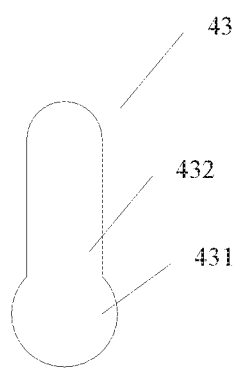
FIG. 12 is a structural schematic view showing a limiting hole according to exemplary embodiments of the present disclosure.

In an exemplary embodiment, as shown in FIG. 3a, the two limiting parts corresponding to the first support arm 31 and the second support arm 32 are connected to each other at a side away from the connecting part 50, that is, the first limiting part 41 and the second limiting part 42 form a limiting hole 43 after being spliced along the shown broken lines. The limiting hole 43 shown in FIG. 3a has a "T" shape for the purpose of wall hanging. It can be understood that the specific shape of the limiting hole 43 may be adjusted as needed. For example, it may have an "M" or other shapes. For other shapes of holes, for example, as shown in FIG. 12, the limiting hole 43 may have a third hole portion 431 and a fourth hole portion 432. The third hole portion 431 has a greater size than the fourth hole portion 432 and is in communication with the fourth hole portion 432. With this form, the limiting hole 43 may be securely attached to a screw fixed to an object such as a wall. That is, a head of the screw first passes through the third hole portion 431, and then reaches the fourth hole portion 432 which is smaller in size than the head of the screw but larger than a rod of the screw, thereby causing the display screen to be securely attached to the screw via the bracket of the exemplary embodiments under an action of gravity of the display screen.

Figure 4:
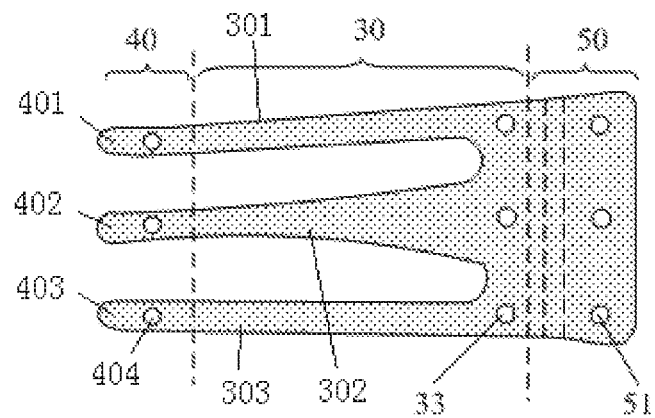
FIGS. 4-6 are structural schematic views showing a bracket according to other exemplary embodiments of the present disclosure.

Some exemplary embodiments of the disclosure provide another bracket. As shown in FIG. 4, the bracket includes: a support arm 30; a limiting part 40 disposed at a side of the support arm 30 and connected to the support arm 30; and a connecting part 50 disposed at a side of the support arm 30 opposite to the limiting part 40 and connected to the support arm 30. The connecting part 50 is provided with at least one support fixing hole 51, and the support arm 30 is provided with at least one hanging fixing hole 33.

In the exemplary embodiments, as shown in FIG. 4, the support arm 30 includes three sub-support arms, i.e., a first support arm 301, a second support arm 302 and a third support arm 303, the three sub-support arms are connected to the same connecting part 50. The limiting part 40 includes three sub-limiting parts, i.e., a first limiting part 401, a second limiting part 402 and a third limiting part 403, and the three sub-limiting parts and the three sub-support arms are connected to each other in a one-to-one manner. Each of the sub-support arms is provided with a hanging fixing hole, each of the sub-limiting parts is provided with a limiting hole 404, and the connecting part 50 is provided with three support fixing holes. Different from the exemplary embodiments shown in FIGS. 2a to 3c, the support arm 30 is further provided with the third support arm 303, the first limiting part 401 is provided at a side of the first support arm 301, the second limiting part 402 is provided at a side of the second support arm 302, and the third limiting part 403 is provided at a side of the third support arm 303, where each of the first, second and third limiting parts 401, 402 and 403 is provided with a limiting hole 404.

Figure 5:
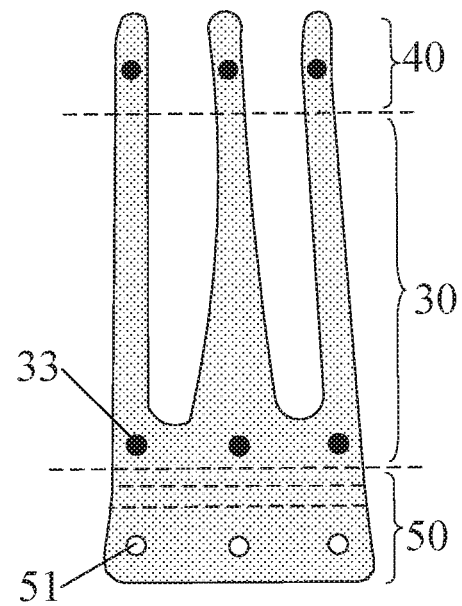
Figure 6:
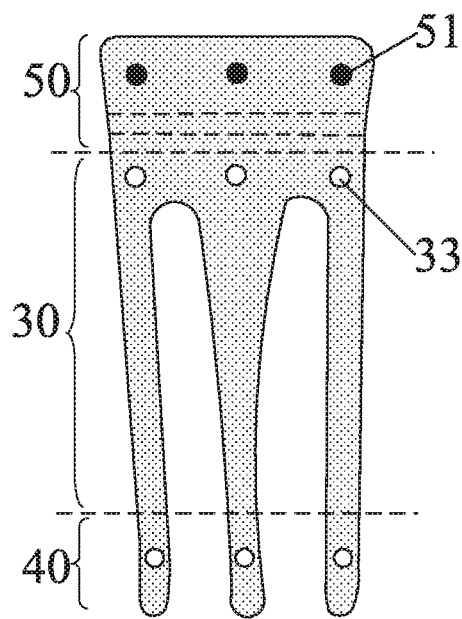

The bracket according to the exemplary embodiments may be used for hanging a display screen to realize the wall hanging mode, or may be used for supporting the display screen to realize the placement mode. Specifically, when the bracket is used for hanging the display screen, as shown in FIG. 5, the hanging fixing hole 33 is fixed to a back of the display screen (the hanging fixing hole 33 in the connected state is shown by a black dot), and the limiting part 40 is closer to a higher edge of the display screen in a vertical direction, that is, the limiting hole of the limiting part 40 is higher than the hanging fixing hole 33. In this case, hanging of the display screen may be realized by merely hanging the limiting hole of the limiting part 40 on the wall (the limiting hole in the connected state is shown by a black dot). Then, the limiting part 40 bears the gravity of the display screen. When the display screen is placed, as shown in FIG. 6, the at least one support fixing hole 51 is fixed to the display screen (the support fixing hole 51 in the connected state is shown by a black dot), and the limiting part 40 is closer to a lower edge of the display screen in the vertical direction, that is, the limiting part 40 is lower than the support fixing hole 51. Then, the limiting part 40 contacts the table top to function as a support, while the bracket is at the back of the display screen to support the display screen. It can be seen that the bracket according to the exemplary embodiments can realize either the placement mode or the wall hanging mode, and has a simple appearance and convenient installation, thus being suitable for various display screens.

It should be understood that other aspects of the exemplary embodiments shown in FIGS. 4-6 are similar to those shown in FIGS. 2a to 3c, and thus are not repeated here. For example, the bracket according to the exemplary embodiments shown in FIGS. 4-6 also has a curved limiting part and a curved connecting part, and the support arm is also a telescopic support arm.

Figure 7:
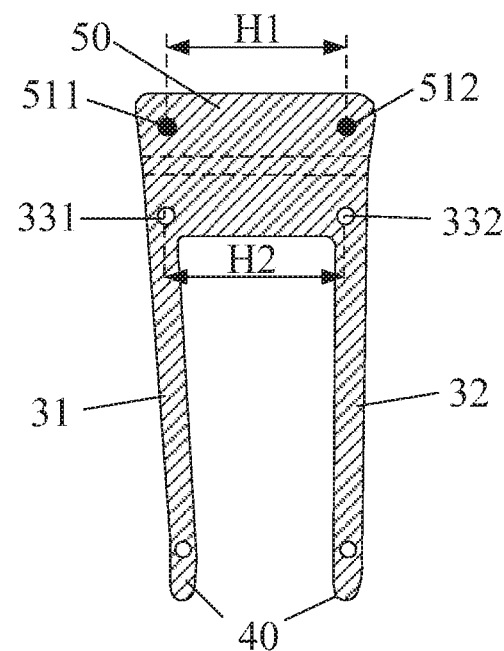
FIG. 7 is a structural schematic view showing a bracket according to yet other exemplary embodiments of the present disclosure.

Some exemplary embodiments of the disclosure provide yet another bracket. As shown in FIG. 7, the bracket includes two support arms, which are a first support arm 31 and a second support arm 32, respectively. Each of the support arms is provided with a limiting part 40 at one side, where the two limiting parts 40 are spaced apart from each other, and each of the support arms is provided with a connecting part 50 at a side opposite to the limiting part 40, where the first support arm 31 and the second support arm 32 are connected to the same connecting part 50. The first support arm 31 is provided with a first hanging fixing hole 331, and the second support arm 32 is provided with a second hanging fixing hole 332. The connecting part 50 is provided with a first support fixing hole 511 and a second support fixing hole 512. A distance between the first hanging fixing hole 331 and the second hanging fixing hole 332 is the same as a distance between the first support fixing hole 511 and the second support fixing hole 512.

As shown in FIG. 7, the distance between the first support fixing hole 511 and the second support fixing hole 512 is H1, and the distance between the first hanging fixing hole 331 and the second hanging fixing hole 332 is H2. In the exemplary embodiments, H1 is designed to be equal to H2. When the bracket is used for the display screen, only two corresponding connecting slots are provided at the back of the display screen for screwing with the support fixing holes 511, 512 or the hanging fixing holes 331, 332. If H1 is different from 112, a corresponding group of connecting slots (two for each group) are respectively provided for the support fixing holes 511, 512 or the hanging fixing holes 331, 332, thereby increasing the number of connecting slots at the back of the display screen.

It should be understood that other aspects of the exemplary embodiment shown in FIG. 7 are similar to those shown in FIGS. 2a to 3c, and thus are not repeated here. For example, the bracket according to the exemplary embodiment shown in FIG. 7 also has a curved limiting part and a curved connecting part, and the support arm is also a telescopic support arm.

Some exemplary embodiments of the disclosure provide a display device including a display screen 1 and the bracket described above.

The bracket is suitable for placing or wall-hanging various display screens 1. During long-term use, the user may change the disposing mode of the display screen 1 according to actual needs.

Figure 13A:
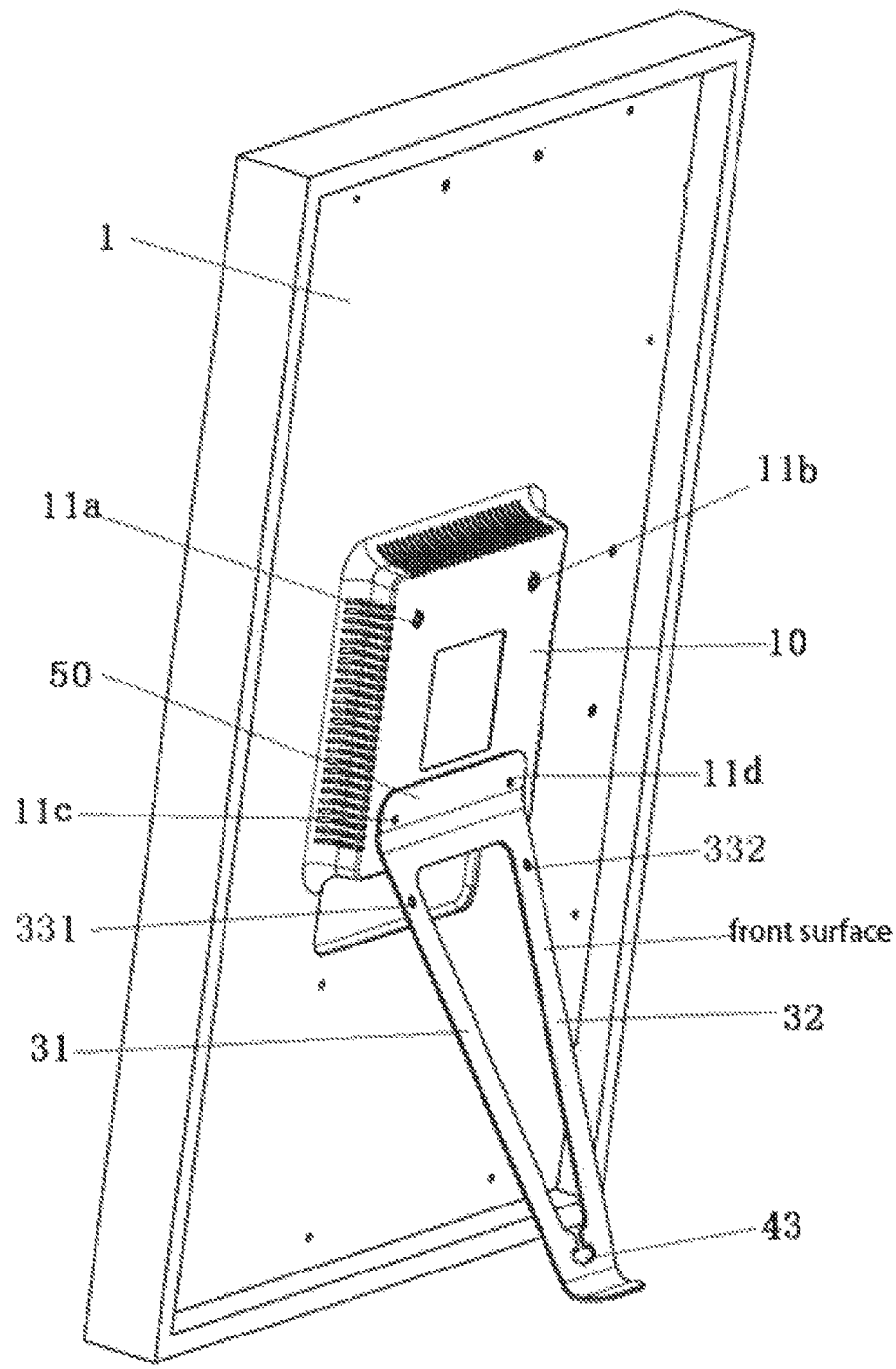
FIGS. 13a-13g are structural schematic views showing display devices according to exemplary embodiments of the present disclosure.
Figure 13B:
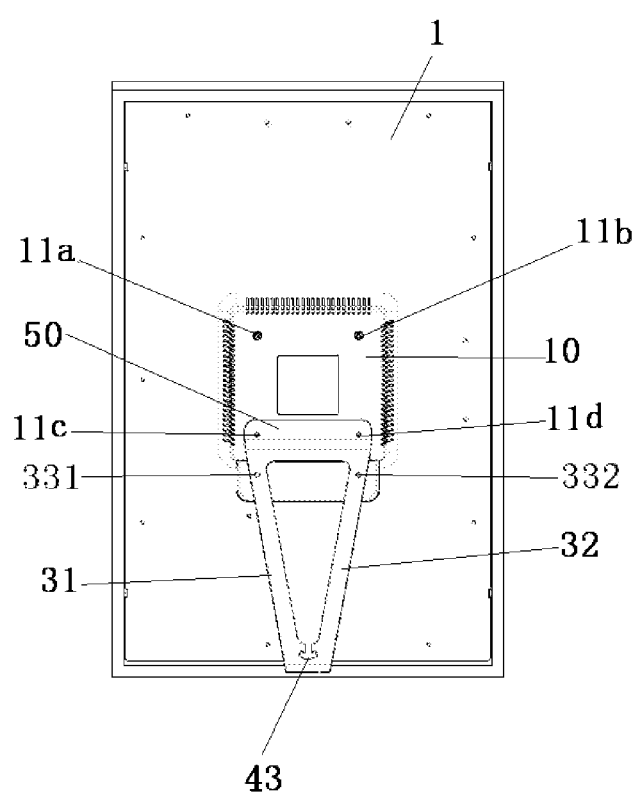
Figure 13C:
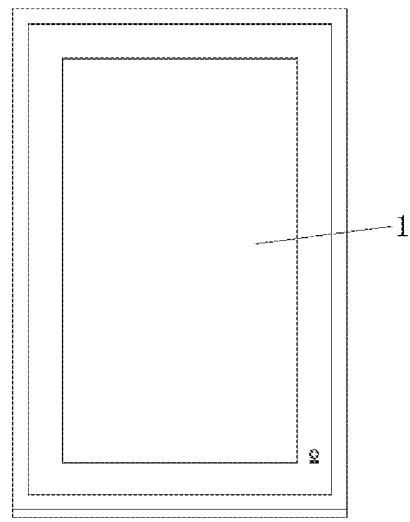
Figure 13D:
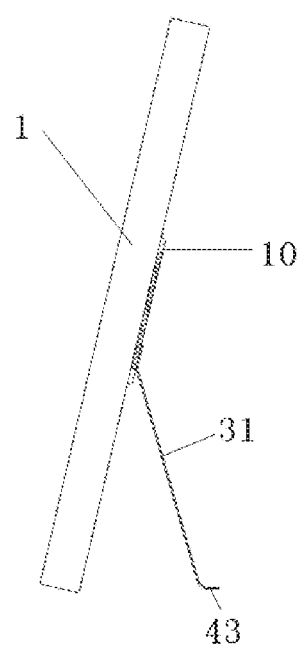
Figure 13E:
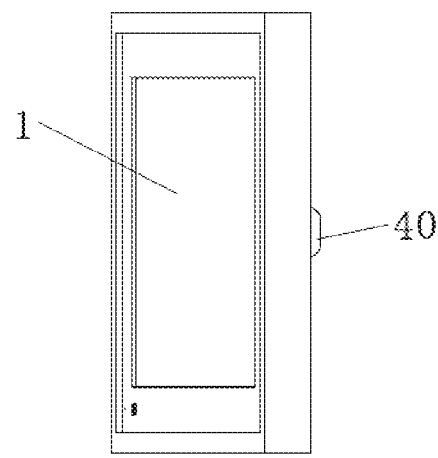
Figure 13F:
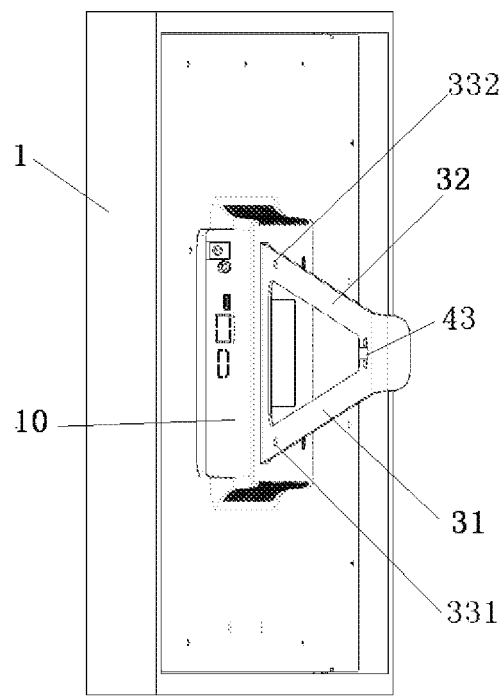
Figure 13G:
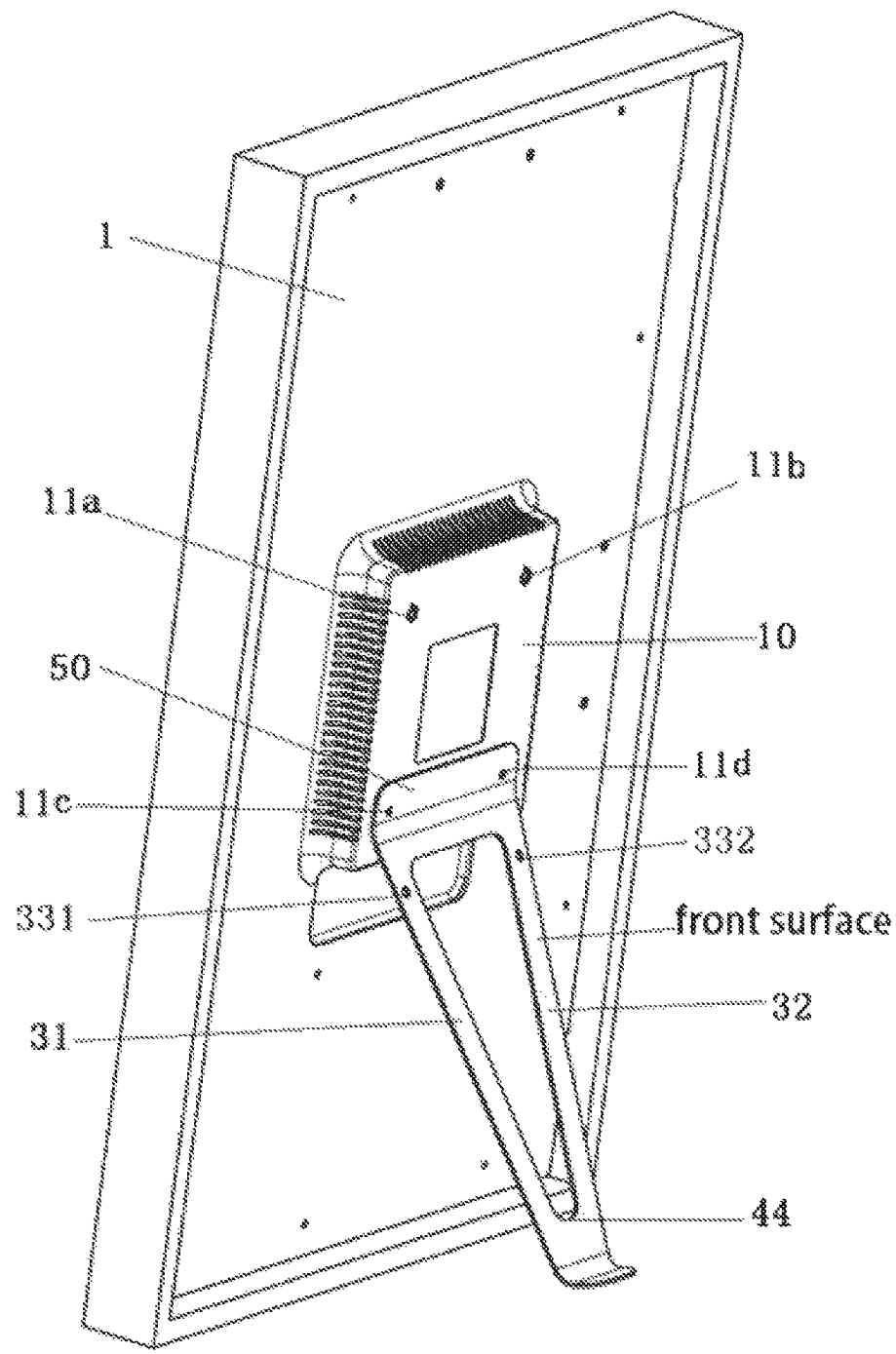

As an alternative to the exemplary embodiments, for example, as shown in FIG. 13a or 13g, a back of the display screen 1 is provided with a connecting slot 11 (specifically, for example, 11a-11d) which is fixed to the bracket via at least one hanging fixing hole 33 when the bracket is used for hanging.

As an alternative to the exemplary embodiments, for example, as shown in FIG. 13a or 13g, the back of the display screen 1 is provided with a connecting slot 11 (specifically, for example, 11a-11d) which is fixed to the bracket via at least one support fixing hole 51 when the bracket is used for supporting.

Specifically, as shown in FIG. 8a or 8b, the back of the display screen 1 is provided with a base 10 having a connecting slot 11, and the display screen 1 may be hung by screwing the hanging fixing hole 33 with the connecting slot 11 in the base 10 of the display screen 1. When the disposing mode of the display screen 1 is changed to be placed, as shown in FIG. 13a or 13g, the screwed hanging fixing hole 33 and the display screen 1 are simply loosened, and then the support fixing hole 51 is screwed to the display screen 1.

As an alternative to the exemplary embodiments, the back of the display screen 1 is provided with four connecting slots 11, and a distance between two connecting slots 11 in a horizontal direction is the same as a distance between two connecting slots 11 in a vertical direction.

Referring to FIG. 13a or 13g, there are four connecting slots 11 in the base 10 of the display screen 1, which are 11a, 11b, 11c, and 11d, respectively. Positions of the four connecting slots 11 may be regarded as being located at four corners of a square. That is, a line that connects 11a, 11b, 11c, and 11d one by one forms a square. For convenience of explanation, a side of the bracket in FIG. 13a or 13g that is not in contact with the base 10 of the display screen 1 (i.e., the side facing away from the base 10) is marked as the front side, and the other side (i.e., the side in contact with the base 10 of the display 1) is the back side. Thus, the display screen 1 may be fixed to the bracket and exhibits the following disposing modes.

I. Vertical Screen Supported Placement

As shown in FIG. 13a or 13g, the back side of the bracket is in contact with the base 10 of the display screen 1 while the front side is exposed. The connecting slots 11c and 11d are respectively fixed to the first support fixing hole 511 and the second support fixing hole 512. The hanging position 44 is located at a lower position, that is, the limiting part 40 is placed on the same horizontal plane with a bottom side (short side) of the display screen 1 when vertically placed, thereby realizing the vertical screen supported placement. In the accompanying drawings, FIG. 13b is a rear view of the display device in the vertical screen supported placement shown in FIG. 13a, FIG. 13c is a front view of the vertical screen supported placement, FIG. 13d is a side view of the vertical screen supported placement, FIG. 13e is a top view of the vertical screen supported placement, and FIG. 13f is a bottom view of the vertical screen supported placement.

II. Horizontal Screen Supported Placement

Figure 14A:
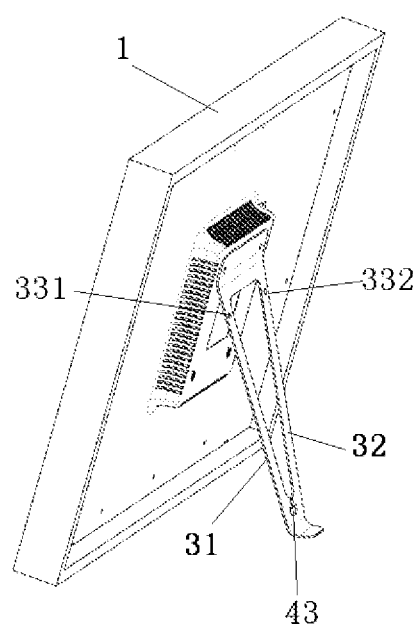
FIGS. 14a-14g are structural schematic views showing display devices according to exemplary embodiments of the present disclosure.
Figure 14B:
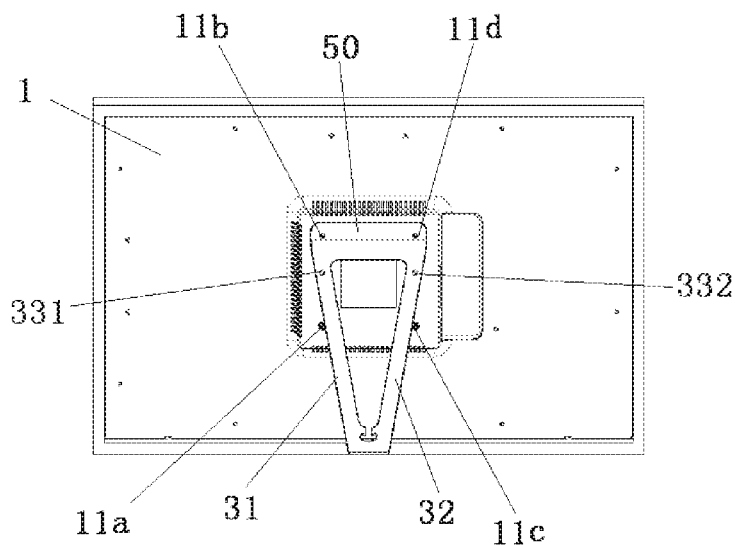
Figure 14C:
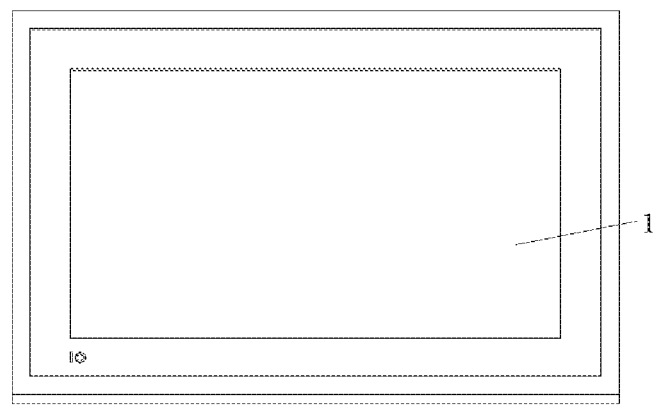
Figure 14D:
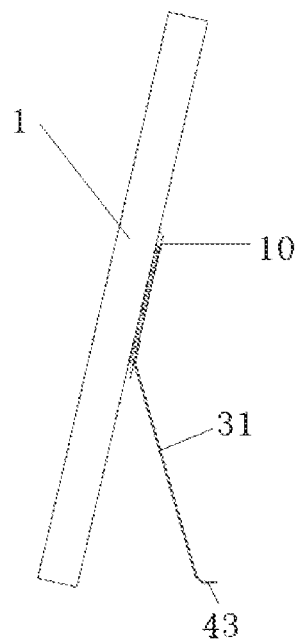
Figure 14E:
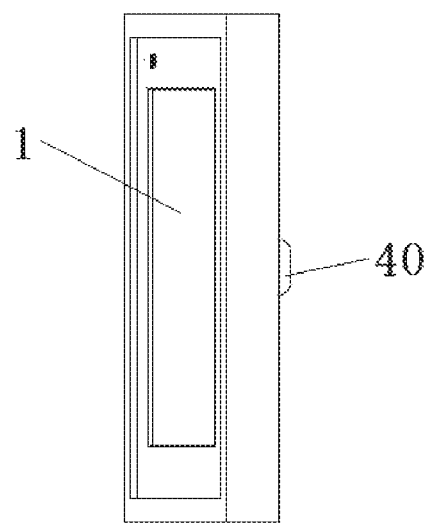
Figure 14F:
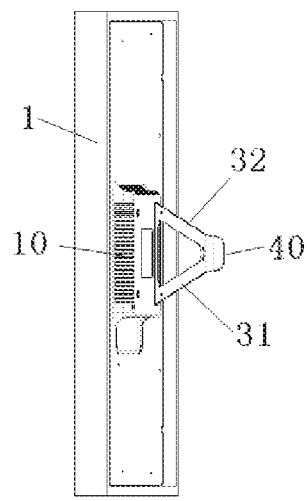
Figure 14G:
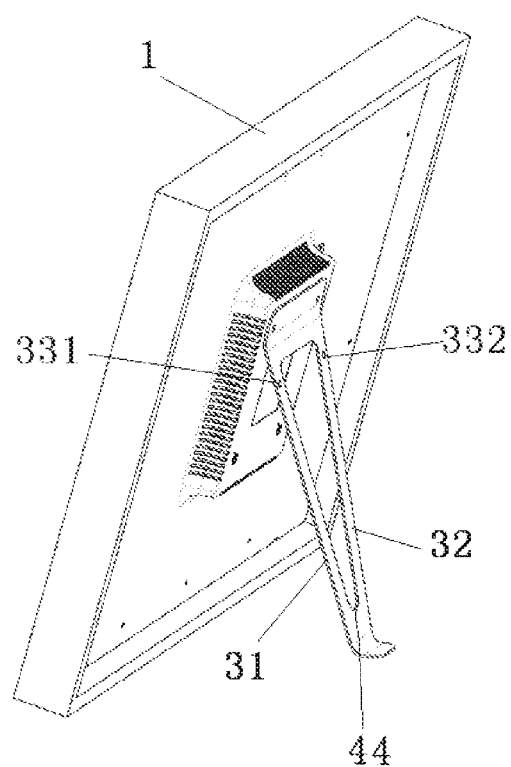

As shown in FIG. 14a or 14g, the back side of the bracket is in contact with the base 10 of the display screen 1 while the front side is exposed. The connecting slots 11b and 11d are respectively fixed to the first support fixing hole 511 and the second support fixing hole 512. The hanging position 44 is located at a lower position, that is, the limiting part 40 is placed on the same horizontal plane with a bottom side (long side) of the display screen 1 when horizontally placed, thereby realizing the horizontal screen supported placement. In the accompanying drawings, FIG. 14b is a rear view of the display device in the horizontal screen supported placement shown in FIG. 14a, 14c is a front view of the horizontal screen supported placement, FIG. 14d is a side view of the horizontal screen supported placement, FIG. 14e is a top view of the horizontal screen supported placement, and FIG. 14f is a bottom view of the horizontal screen supported placement.

III. Vertical Screen Wall Hanging

Figure 15A:
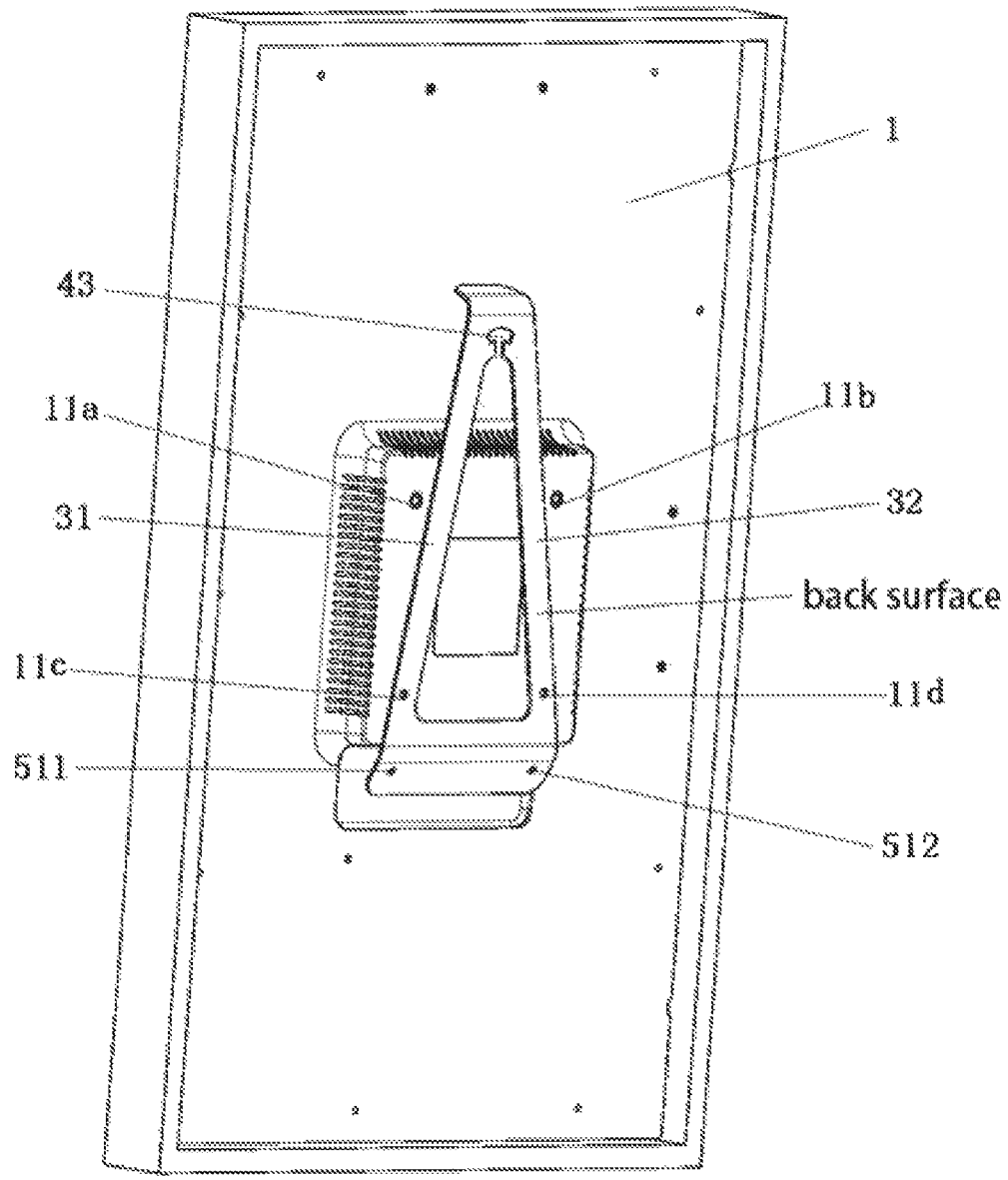
FIGS. 15a-15g are structural schematic views showing display devices according to exemplary embodiments of the present disclosure.
Figure 15B:
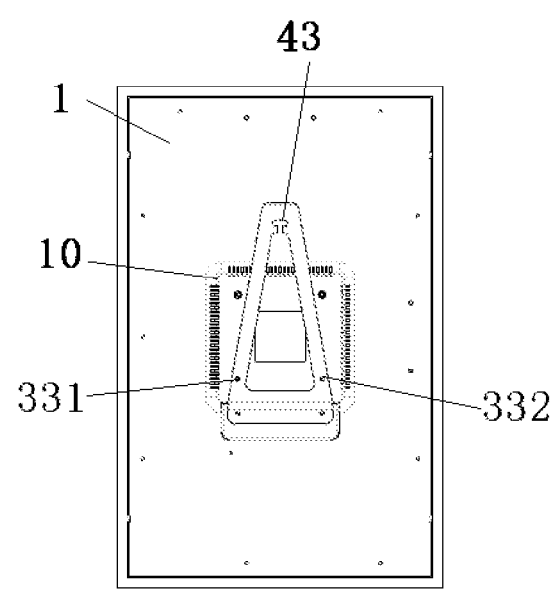
Figure 15C:
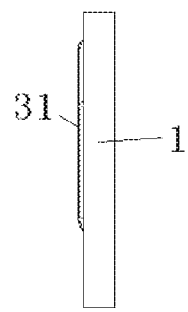
Figure 15D:
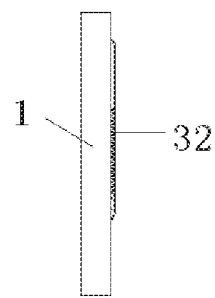
Figure 15E:
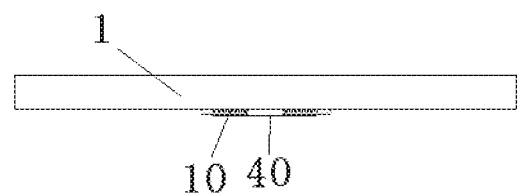
Figure 15F:
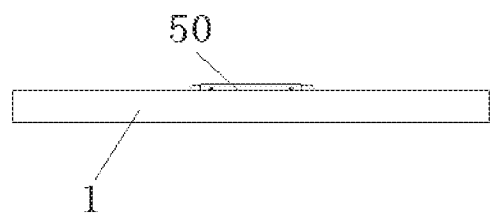
Figure 15G:
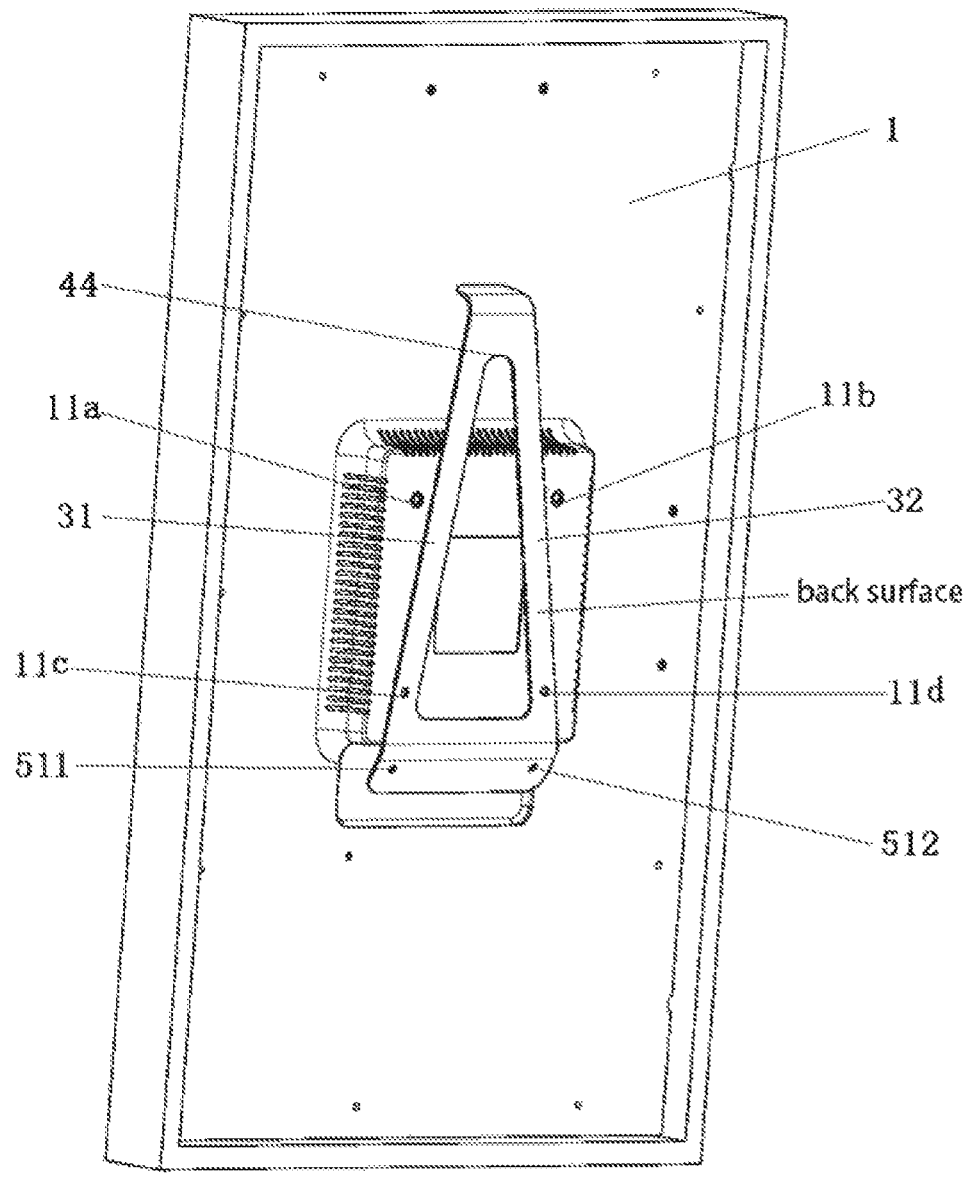

As shown in FIG. 15a or 15g, the front side of the bracket is in contact with the base 10 of the display screen 1 while the back side is exposed. The connecting slots 11c and 11d are respectively fixed to the first hanging fixing hole 331 and the second hanging fixing hole 332. The hanging position 44 is located at a higher position, thereby realizing vertical screen wall hanging. In the accompanying drawings, FIG. 15b is a rear view of the display device in the vertical screen wall hanging shown in FIG. 15a, FIG. 15c is a left view of the vertical screen wall hanging, FIG. 15d is a right view of the vertical screen wall hanging, FIG. 15e is a top view of the vertical screen wall hanging, and FIG. 15f is a bottom view of the vertical screen wall hanging.

IV. Horizontal Screen Wall Hanging

Figure 16A:
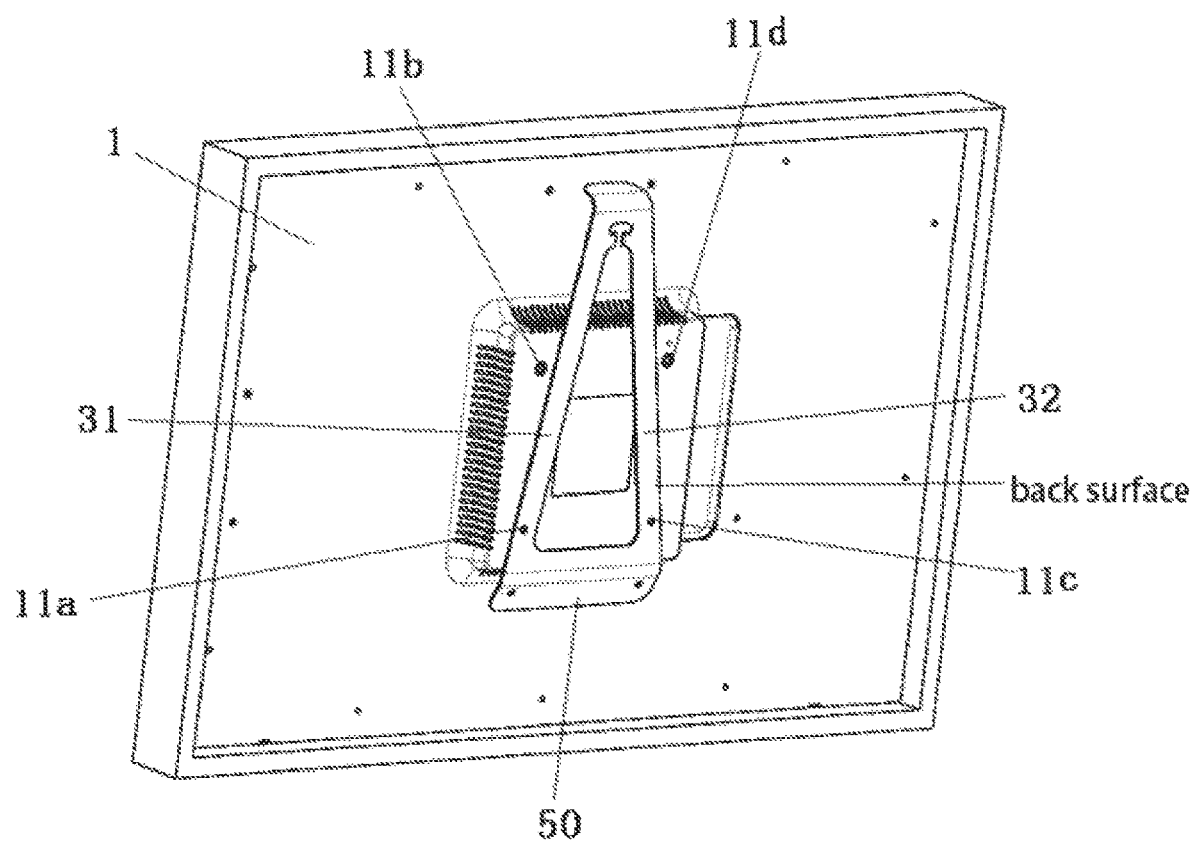
FIGS. 16a-16g are structural schematic views showing display devices according to exemplary embodiments of the present disclosure.
Figure 16B:
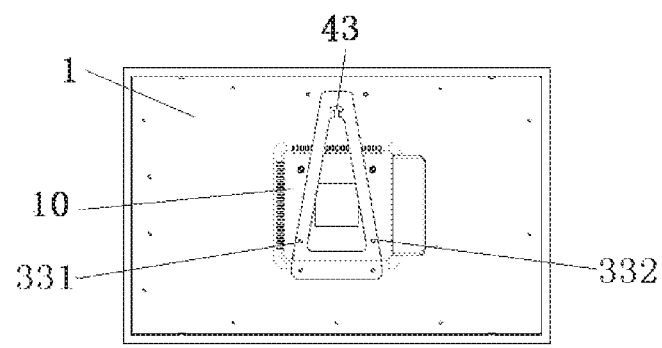
Figure 16C:
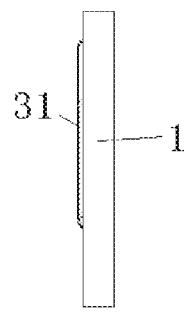
Figure 16D:
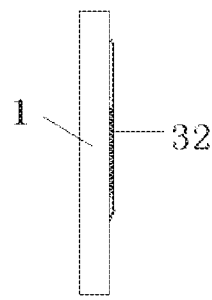
Figure 16E:
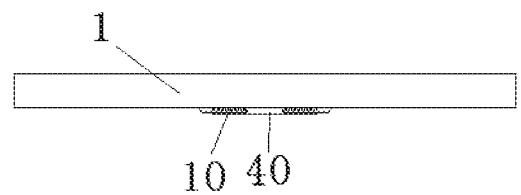
Figure 16F:
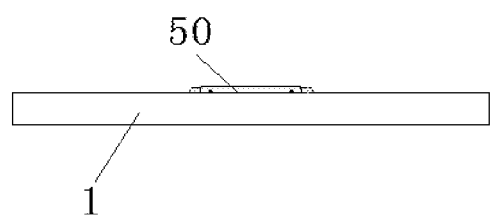
Figure 16G:
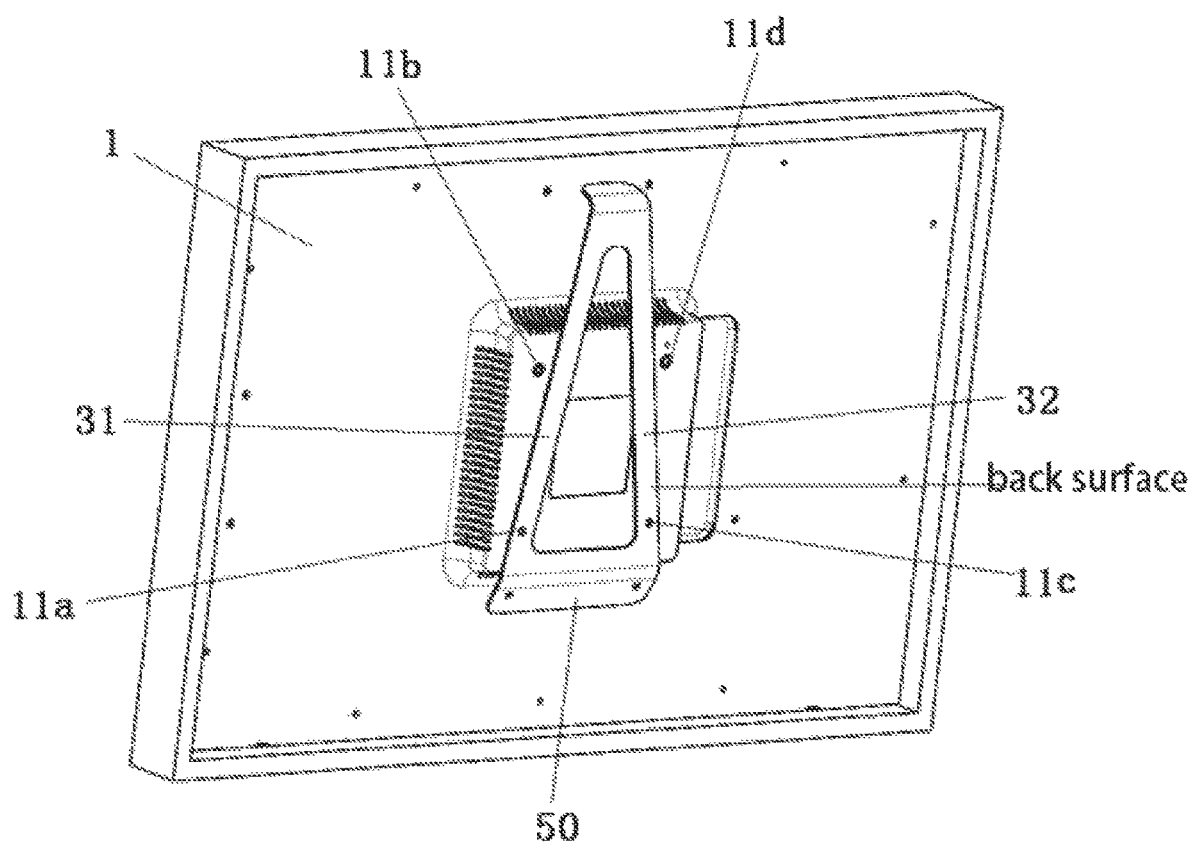

As shown in FIG. 16a or 16g, the front side of the bracket is in contact the base 10 of the display screen 1 while the back side is exposed. The connecting slots 11a and 11c are respectively fixed to the first hanging fixing hole 331 and the second hanging fixing hole 332. The hanging position 44 is located at a higher position, thereby realizing horizontal screen wall hanging. In the accompanying drawings, FIG. 16b is a rear view of the display device in the horizontal screen wall hanging shown in FIG. 16a, FIG. 16c is a left view of the horizontal screen wall hanging, FIG. 16d is a right view of the horizontal screen wall hanging, FIG. 16e is a top view of the horizontal screen wall hanging, and FIG. 16f is a bottom view of the horizontal screen wall hanging.

Figure 17:
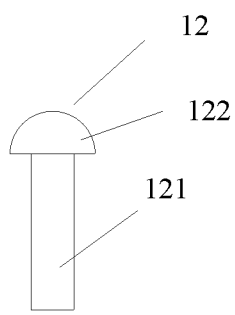
FIG. 17 is a structural schematic view showing a T-shaped telescopic member of the display device according to exemplary embodiments of the disclosure.

It should be understood that the above description of the exemplary embodiments is directed to embodiments in which the connection between the bracket and the display screen is achieved by screwing. However, the present disclosure is not limited thereto, and the connection between the bracket and the display screen may be realized by any suitable manner, for example, a manner that does not require fastening. Specifically, as shown in FIG. 17, a T-shaped telescopic member 12 is provided in the connecting slot 11 at the back side of the display screen. When not in use, the T-shaped telescopic member 12 is retracted in the connecting slot 11 and does not protrude from a surface of the base 10 of the display screen 1; when in use, the T-shaped telescopic member 12 extends from the connecting slot 11 and protrudes from the surface of the base 10 of the display screen 1. In this case, the T-shaped telescopic member 12 may extend into one of the hanging fixing holes 331, 332 and the support fixing holes 511, 512 (see FIG. 11) to connect the bracket with the display screen. More specifically, the T-shaped telescopic member 12 has a head portion 122 and a rod portion 121 forming a stepped structure (see FIG. 17). The hanging fixing holes 331, 332 and the support fixing holes 511, 512 have the configuration as shown in FIG. 11. The head portion 122 of the T-shaped telescopic member 12 first passes through the first hole portion 5121, and then reaches the second hole portion 5122 which is smaller in size than the head portion 122 but larger than the rod portion 121, whereby the display screen and the bracket are securely attached by the engagement of the step structure between the head portion 122 and the rod portion 121 with the bracket under an action of gravity of the display screen. In this manner, the display screen and the bracket may be reliably connected in a manner that does not require fastening, so that the user can operate conveniently, saving time and labor.

It should be understood that in the exemplary embodiments described above, the specific number of the support arms, the support fixing holes, and the hanging fixing holes may be adjusted as needed, for example, when used for display screens which have a greater size and weight, the number of support arms, support fixing holes, and hanging fixing holes may be appropriately increased, and vice versa. In addition, the specific positions of the support fixing holes and the hanging fixing holes may be selected according to actual conditions, and will not be exemplified herein.

In the present disclosure, by adopting the bracket of the above-described exemplary embodiments, after the display screen is removed from the bracket, for example, placing the display screen on other surfaces, a separate connecting member at the back of the display screen is avoided, which facilitate convenient installation as well as switches between vertical and horizontal screens or other orientations.

Some exemplary embodiments of the disclosure provide a display device including any one of the above brackets. The display device may be a liquid crystal display panel, an electronic paper, an OLED panel, a mobile phone, a tablet PC, a television, a monitor, a notebook computer, a digital album, a navigator or any other product or component having a display function.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A bracket comprising:
   a support arm;
   a limiting part disposed at a side of the support arm and connected to the support arm; and
   a connecting part disposed at a side of the support arm opposite to the limiting part and connected to the support arm,
   wherein the connecting part is provided with at least one support fixing hole;
   wherein the support arm is provided with at least one hanging fixing hole and includes a first support arm and a second support arm, and the at least one hanging fixing hole includes a first hanging fixing hole provided on the first support arm and a second hanging fixing hole provided on the second support arm,
   wherein the at least one support fixing hole includes a first support fixing hole and a second support fixing hole, and
   a distance between the first hanging fixing hole and the second hanging fixing hole is the same as a distance between the first support fixing hole and the second support fixing hole.

2. The bracket according to claim 1,
   wherein the bracket has a triangular shape.

3. The bracket according to claim 1,
   wherein the connecting part has a planar shape, and is provided with at least two support fixing holes thereon.

4. The bracket according to claim 1,
   wherein the connecting part includes a first curved portion with a curvature r1 disposed between two planar portions of the connecting part and connected to the support arm via one of the planar portions, where r1 is in the range of 0.04-0.06 $cm^{-1}$.

5. The bracket according to claim 4,
   wherein the limiting part includes a second curved portion with a curvature r2 disposed between two planar portions of the limiting part and connected to the support arm via one of the planar portions, where r2 is in the range of 0.1-0.12 $cm^{-1}$.

6. The bracket according to claim 5,
   wherein the connecting part and the limiting part are curved toward the same side with respect to the support arm.

7. The bracket according to claim 1,
   wherein the support arm is a telescopic support arm, and wherein the support arm includes a telescopic chute, and a telescopic rod disposed in the telescopic chute, the telescopic rod is slidable relative to the telescopic chute, an end of the telescopic rod is provided with a first through hole, a spring and two steel balls at both ends of the spring are disposed in the first through hole, and either side of the telescopic chute is provided with at least one second through hole into which at least part of the steel ball can enter.

8. The bracket according to claim 1,
   wherein the support arm, the limiting part and the connecting part are integrally formed.

9. The bracket according to claim 1,
   wherein the at least one support fixing hole and the at least one hanging fixing hole are slotted holes.

10. The bracket according to claim 1,
    wherein the at least one support fixing hole and the at least one hanging fixing hole each have a first hole portion and two second hole portions, where the first hole portion has a greater size than the second hole portions and is in communication with the two second hole portions, while the two second hole portions are symmetrically disposed with respect to the first hole portion.

11. The bracket according to claim 1,
wherein a first limiting part is provided at a side of the first support arm, a second limiting part is provided at a side of the second support arm, and the first and second limiting parts are spliced to form a limiting hole.

12. The bracket according to claim 11,
wherein the limiting hole has a third hole portion and a fourth hole portion, and the third hole portion has a greater size than the fourth hole portion and is in communication with the fourth hole portion.

13. The bracket according to claim 1,
wherein the support arm is further provided with a third support arm, a first limiting part is provided at a side of the first support arm, a second limiting part is provided at a side of the second support arm, and a third limiting part is provided at a side of the third support arm, where each of the first, second and third limiting parts is provided with a limiting hole.

14. A display device comprising a display screen and the bracket according to claim 1.

15. The display device according to claim 14,
wherein the display screen is provided with a connecting slot for connecting to the bracket via the at least one hanging fixing hole provided on the support arm when the bracket is used for hanging.

16. The display device according to claim 14,
wherein the display screen is provided with a connecting slot for connecting to the bracket via the at least one support fixing hole when the bracket is used for supporting.

17. The display device according to claim 14,
wherein the display screen is provided with four connecting slots, and a distance between two connecting slots in a horizontal direction is the same as a distance between two connecting slots in a vertical direction.

18. The display device according to claim 17,
wherein the connecting slot is provided with a T-shaped telescopic member that is inserted into one of the at least one hanging fixing hole provided on the support arm and the at least one support fixing hole so that the bracket is connected to the display screen.

\* \* \* \* \*